(12) United States Patent
Witcraft et al.

(10) Patent No.: US 7,420,365 B2
(45) Date of Patent: Sep. 2, 2008

(54) SINGLE CHIP MR SENSOR INTEGRATED WITH AN RF TRANSCEIVER

(75) Inventors: William F. Witcraft, Minneapolis, MN (US); Jeffrey J. Kriz, Eden Prairie, MN (US)

(73) Assignee: Honeywell International Inc., Morristown, NJ (US)

( * ) Notice: Subject to any disclaimer, the term of this patent is extended or adjusted under 35 U.S.C. 154(b) by 160 days.

(21) Appl. No.: 11/376,509

(22) Filed: Mar. 15, 2006

(65) Prior Publication Data

US 2007/0216406 A1   Sep. 20, 2007

(51) Int. Cl.
*G01R 33/02* (2006.01)
(52) U.S. Cl. .................... 324/252; 257/427
(58) Field of Classification Search ............ 324/207.21, 324/244, 247, 252, 260–262; 338/32 H, 338/32 R; 257/414, 421, 425, 427
See application file for complete search history.

(56) References Cited

U.S. PATENT DOCUMENTS

| | | | | |
|---|---|---|---|---|
| 4,847,584 | A | 7/1989 | Pant | 338/32 R |
| 5,117,232 | A | 5/1992 | Cantwell | 342/357 |
| 5,247,278 | A | 9/1993 | Pant et al. | 338/32 R |
| 5,502,325 | A | 3/1996 | Sokolich et al. | 257/421 |
| 5,521,501 | A | 5/1996 | Dettmann et al. | 324/252 |
| 5,790,477 | A | 8/1998 | Hauke | 368/10 |
| 5,820,924 | A | 10/1998 | Witcraft et al. | 427/130 |
| 5,940,319 | A | 8/1999 | Durlam et al. | 365/171 |
| 5,995,023 | A | 11/1999 | Kreft | 340/995 |
| 6,054,780 | A | 4/2000 | Haigh et al. | 307/91 |
| 6,215,360 | B1 | 4/2001 | Callaway, Jr. | 330/310 |
| 6,219,273 | B1 | 4/2001 | Katti et al. | 365/158 |
| 6,252,390 | B1 | 6/2001 | Black et al. | 324/127 |
| 6,331,924 | B1 | 12/2001 | Takada | 360/323 |
| 6,461,914 | B1 | 10/2002 | Roberts et al. | 438/253 |
| 6,462,983 | B2 | 10/2002 | Katti et al. | 365/171 |
| 6,710,424 | B2 | 3/2004 | Schmidt | 257/531 |
| 7,123,139 | B2 * | 10/2006 | Sweeney | 340/521 |
| 7,164,384 | B2 * | 1/2007 | Howard | 342/357.07 |
| 2002/0008661 | A1 | 1/2002 | McCall et al. | 342/357.14 |
| 2002/0021580 | A1 | 2/2002 | Katti et al. | 365/158 |
| 2002/0083605 | A1 | 7/2002 | Blank et al. | 33/356 |
| 2002/0153551 | A1 | 10/2002 | Wong et al. | 257/303 |
| 2003/0016011 | A1 | 1/2003 | Witcraft et al. | 324/252 |

(Continued)

FOREIGN PATENT DOCUMENTS

DE   3426785 A1   1/1986

(Continued)

OTHER PUBLICATIONS

International Search Report for PCT/US2004/017361 (mailed May 20, 2005).

(Continued)

*Primary Examiner*—Jay M Patidar (57) ABSTRACT

At least one magnetic field sensing device and an RF transceiver are integrated in a discrete, single-chip package. Rather than requiring at least two separate chips to wirelessly transmit the device output, an integrated, single chip solution can be used. The single chip integration of the at least one magnetic field sensing device and the RF transceiver can reduce the physical space required and, therefore, allow such devices to be smaller, lighter, and possibly more portable.

10 Claims, 6 Drawing Sheets

U.S. PATENT DOCUMENTS

| | | | |
|---|---|---|---|
| 2003/0042900 A1 | 3/2003 | Witcraft et al. | 324/252 |
| 2003/0042901 A1 | 3/2003 | Witcraft et al. | 324/252 |
| 2003/0091846 A1 | 5/2003 | Kobayashi et al. | 428/493 |
| 2003/0162507 A1 | 8/2003 | Vatt | 455/73 |
| 2004/0137275 A1 | 7/2004 | Jander et al. | 428/692 |
| 2004/0185811 A1 | 9/2004 | Woo et al. | 455/131 |
| 2004/0207035 A1 | 10/2004 | Witcraft et al. | 257/427 |
| 2004/0207400 A1 | 10/2004 | Witcraft et al. | 324/252 |
| 2004/0254726 A1 | 12/2004 | Witcraft et al. | 701/217 |
| 2005/0218465 A1* | 10/2005 | Cummins | 257/414 |

FOREIGN PATENT DOCUMENTS

| | | | |
|---|---|---|---|
| EP | 0544479 B | | 6/1993 |
| EP | 0656666 A1 | | 6/1995 |
| EP | 1124271 A | | 8/2001 |
| EP | 1221715 | | 7/2002 |
| EP | 1302778 A2 | | 4/2003 |
| EP | 1387146 A2 | | 2/2004 |
| FR | 2830621 A | | 4/2003 |
| JP | 08116107 | | 5/1996 |

OTHER PUBLICATIONS

International Search Report for PCT/US2004/017392 (mailed Nov. 10, 2004).

International Search Report for PCT/US2004/011318 (mailed Dec. 21, 2004).

Geppert, Linda,. "The New Indelible Memories: It's A Three-Way Race In the Multibillion-Dollar Memory Sweepstakes," IEEE Spectrum, Mar. 2003.

"Magnetic Sensors, Frequently Asked Questions" printed from the World Wide Web at http://www.ssec.honeywell/magnetic/faq.htm on May 6, 2003.

"Magnetic Sensor Products HMC/HMR Series," Honeywell International Inc. no date.

"Honeywell Magnetic Sensors Product Catalog," Honeywell International Inc. no date.

"1-and 2-Axis Magnetic Sensors HMC1001/1002 : HMC1021/1022," Honeywell no date available.

"Radio On A Chip 300—928 MHz FSK Transceiver Frequency Agile with SPI Bus Interface," Honeywell International Inc., HRF-ROC09325, Published Jun. 2003, www.mysoiservices.com, pp. 1-4.

"Linear/Angular/Rotary Displacement Sensors HMC1501/HMC1512," Honeywell International Inc., http://www.ssec.honeywell.com, Aug. 2000.

* cited by examiner

SINGLE CHIP MR SENSOR INTEGRATED WITH AN RF TRANSCEIVER

FIELD

The present invention relates generally to a system on a chip (SOC), and more particularly, relates to a magneto-resistive (MR) sensor integrated on a single chip with a radio frequency (RF) transceiver.

BACKGROUND

Magnetic field sensors have applications in magnetic compassing, ferrous metal detection, position sensing, and current sensing. They may be used to detect variations in the magnetic field of machine components and in the earth's magnetic field, as well as to detect underground minerals, electrical devices, and power lines. For such applications, an anisotropic magneto-resistive (AMR) sensor, a giant magneto-resistive (GMR) sensor, a colossal magneto-resistive (CMR) sensor, a Hall sensor, a fluxgate sensor, or a coil sensor that is able to detect small shifts in magnetic fields may be used.

MR sensors, for example, may be formed using typical integrated circuit fabrication techniques. Permalloy, a ferromagnetic alloy containing nickel and iron, is typically used as the magneto-resistive material. Often, the permalloy is arranged in thin strips of permalloy film. When a current is run through an individual strip, the magnetization direction of the strip may form an angle with the direction of current flow.

As the magnetization direction of the strip changes relative to the current flow, its effective resistance also changes. Strip resistance reaches a maximum when the magnetization direction is parallel to the current flow and reaches minimum when the magnetization direction is perpendicular to the current flow. Such changes in strip resistance result in a change in voltage drop across the strip when an electric current is run through it. This change in voltage drop can be measured and used as an indication of the change in the magnetization direction of an external magnetic field acting on the strip.

To form the magnetic field sensing structure of a MR sensor, several permalloy strips may be electrically connected together. The permalloy strips may be placed on the substrate of the MR sensor as a continuous resistor in a "herringbone" pattern or as a linear strip of magneto-resistive material, with conductors across the strip at an angle of 45 degrees to the long axis of the strip. This latter configuration is known as "barber-pole biasing." The positioning of conductors in a "barber-pole biasing" configuration may force the current in a strip to flow at a 45-degree angle to the long axis of the strip. These magneto-resistive sensing structure designs are described in U.S. Pat. No. 4,847,584 titled "Magnetoresistive Magnetic Sensor" and assigned to the same assignee as the current application. U.S. Pat. No. 4,847,584 is hereby fully incorporated by reference.

An MR sensor often includes a number of straps through which current may be applied for controlling and adjusting sensing characteristics. For example, MR sensor designs often include set, reset, and offset straps. These straps can improve the performance and accuracy of the MR sensor, but require driver circuitry for proper operation. Additionally, the MR sensor typically includes other components used for signal conditioning and electrostatic discharge protection, such as operational amplifiers, transistors, capacitors, and so on.

An RF transceiver is commonly used to wirelessly transmit data. For example, RF transceivers are used in short range communication systems. Typically, the RF transceiver is connected to one or more antennas. When receiving data, the RF transceiver filters and down converts RF signals into analog or digital baseband signals. When sending data, the RF transceiver filters, up converts, and amplifies analog or digital baseband signals into RF signals.

By combining the functionality of the MR sensor with that of the RF transceiver, the output of the MR sensor can be wirelessly transmitted. As a result, the output of the MR sensor can be easily obtained. For example, an MR sensor may be located on a pipeline valve to determine the position of the valve (e.g., whether the valve is open or closed). The position of the valve can be wirelessly transmitted to a pipeline control station by the RF transceiver. As a result, a pipeline operator can determine the position of the valve without having to go into the field to manually determine the position of the valve.

Typically, to wirelessly transmit data from an MR sensor at least two chips are placed separately on a printed circuit board. For example, Honeywell's Radio on a Chip (part number HRF-ROC09325) along with data acquisition, data formatting, and control electronics may be used to transmit output data from one or more of Honeywell's MR sensors, such as part numbers HMC1501 and HMC1512. In some applications, multiple chips on a printed circuit board is too unwieldy and inefficient due to the physical space requirements of the RF transceiver chip, the MR sensor chip, and any additional chips required for operation of the MR sensor.

Single chip designs with an MR sensor and other additional circuitry have been described. For example, U.S. Patent Application Publication No. 2004/0207400 describes the integration of an MR sensor with a SET/RESET driver, U.S. Patent Application Publication No. 2004/0207035 describes the integration of an MR sensor with a semiconductor device, and U.S. Patent Application Publication No. 2004/0254726 describes the integration of an MR sensor with a GPS receiver. These applications are assigned to the same assignee as the current application and are hereby fully incorporated by reference. Single chip packaging for an RF transceiver has also been described. However, none of these designs suggest integrating an RF transceiver on the same chip as the MR sensor.

Thus, a single-chip design that would minimize the physical space required to integrate an MR sensor with an RF transceiver would be desirable.

SUMMARY

A system and method for integrating an MR sensor with an RF transceiver on a single integrated circuit is described. The system includes at least one magnetic field sensing device and a transceiver co-located on the same integrated circuit. The at least one magnetic field sensing device is located in a first portion of the integrated circuit and the transceiver is located in a second portion of the integrated circuit.

The system may also include an antenna located in first portion of the integrated circuit. In one example, the antenna is integrated with the at least one magnetic field sensing device. In another example, the at least one magnetic field sensing device is the antenna. The system may also include additional circuitry in the second portion of the integrated circuit. For example, the additional circuitry may include power conditioning electronics, MR sensing electronics, and control and I/O electronics. The system may also include a shielding layer to prevent electromagnetic fields generated in the second portion of the integrated circuit from interfering with the MR sensor operation.

The at least one magnetic field sensing device may be an anisotropic magneto-resistive (AMR) sensor, a giant magneto-resistive (GMR) sensor, a colossal magneto-resistive (CMR) sensor, a Hall sensor, a fluxgate sensor, or a coil sensor. The transceiver wirelessly transmits data from the at least one magnetic field sensing device. In another example, the at least one magnetic field sensing device includes an array of magnetic field sensing devices and the transceiver wirelessly transmits data from the array magnetic field sensing devices.

A method for making a single chip magnetic field sensing device integrated with a transceiver is also described. The method includes forming a transceiver underlayer that includes transceiver circuitry, forming a planar dielectric layer on the transceiver underlayer, and forming at least one magnetic field sensing device above the dielectric layer. The transceiver circuitry and the at least one magnetic field sensing device are formed as a single integrated circuit.

In one example, the at least one magnetic field sensing device is formed within a metal interconnection layer located above the planar dielectric layer. In another example, the at least one magnetic field sensing device is formed between metal interconnection layers located above the planar dielectric layer. The method may also include forming an antenna within or between the metal interconnection layers. The method may also include forming additional circuitry in the transceiver underlayer. The additional circuitry may include power conditioning electronics, MR sensing electronics, or control and I/O electronics.

The transceiver underlayer may be formed using at least one of complementary metal oxide semiconductor (CMOS), gallium-arsenide (GaAs), germanium, bipolar CMOS (BiCMOS), and indium phosphide (InP) technologies. The at least one magnetic field sensing device may be formed on the dielectric layer using lithography, metallization, and etch processes. The transceiver underlayer may be formed before the dielectric layer and the at least one magnetic field sensing device.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1A:
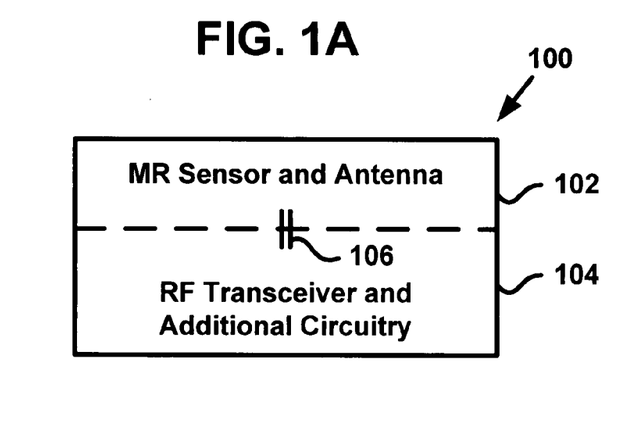
FIGS. 1A-1C are simplified block diagrams of an integrated MR sensor and an RF transceiver, according to some examples.
Figure 1B:
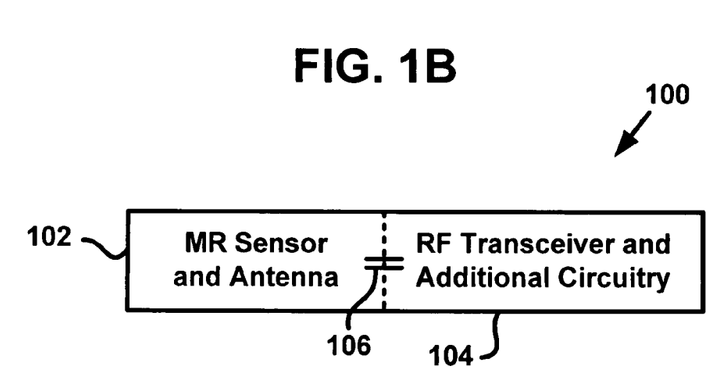
Figure 1C:
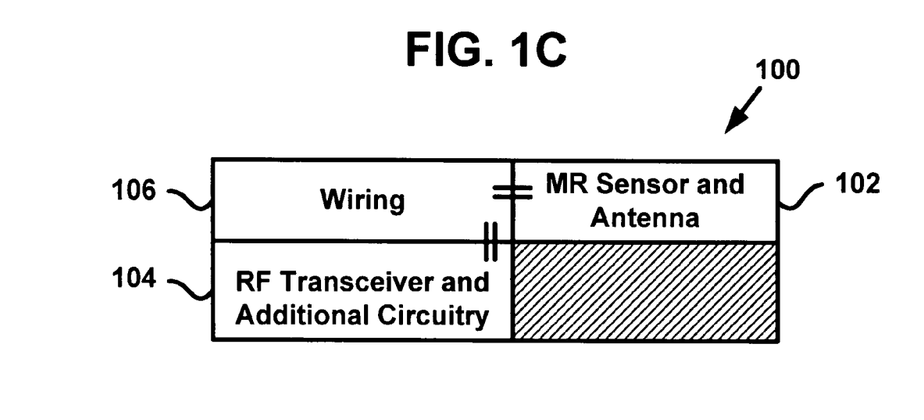

FIGS. 1A-1C are block diagrams illustrating the integration of an MR sensor with an RF transceiver. The device 100 includes a first portion 102 and a second portion 104. The first portion 102 includes the MR sensor and an antenna. The second portion 104 includes the RF transceiver and additional circuitry. The additional circuitry may include power conditioning electronics, MR sensing electronics, and control and I/O electronics. The second portion 104 may also include other circuitry, such as circuitry for electro-static discharge (ESD) protection for the MR sensor in the first portion 102.

The first and second portions 102, 104 are included within a single chip, so that the device 100 is a discrete, one-chip design. The term "chip" is a term of art and refers to an integrated circuit. The term "single chip" as used herein means that a single integrated circuit or die is used for fabricating the MR sensor and the RF transceiver.

The first and second portions 102, 104 of the device 100 may be manufactured using standard fabrication processes, such as complementary metal oxide semiconductor (CMOS), which includes bulk, silicon-on-insulator (SOI) and microwave-on-insulator (MOI) technologies; gallium-arsenide (GaAs); germanium; bipolar CMOS (BiCMOS); and indium phosphide (InP). Preferably, the first portion 102 is manufactured using standard lithography, metallization, and etch processes; while the second portion 104 is preferably manufactured using Honeywell's MOI-5 0.35 micron processing or GaAs processing. While a technology like GaAs may provide advantages in operational speed, reduced power consumption might be best realized through the use of other techniques, such as those involving SOI or MOI.

Integrating the MR sensor with the RF transceiver in a single chip design may be accomplished in a variety of ways. Three examples are depicted in FIG. 1. In FIG. 1A, the first portion 102 and the second portion 104 are located in discrete vertical layers in a single die. Preferably, the MR sensor and antenna are located in the first portion 102, which is fabricated on the second portion 104, which preferably includes the RF transceiver and other circuitry. The dashed line between the first and second portions 102, 104 indicates that the discrete vertical layers may not be linear and may have varying dimensions.

It may be advantageous to include one or more electrical connections between the first portion 102 and the second portion 104 to provide feedback, for example. For example, wiring 106 may be used to connect the MR sensor and antenna to the RF transceiver and the other circuitry. Alternatively, the first portion 102 and the second portion 104 may simply be located physically close to one another with no intentional electrical interaction.

FIG. 1B illustrates another way in which the MR sensor may be integrated with a RF transceiver. In this example, the first portion 102 and the second portion 104 are formed adjacent to each other in discrete horizontal layers on the same die. The MR sensor and the antenna are fabricated on a first portion 102, while the RF transceiver and the other circuitry are fabricated on a second portion 104. The dashed line between the first and second portions 102, 104 indicates that the discrete horizontal layers may not be linear and may have varying dimensions. In addition, the wiring 106 may be used to connect circuitry in the first portion 102 to circuitry in the second portion 104.

FIG. 1C illustrates yet another example of a single die integration in which the first portion 102 and the second portion 104 are contained in a single die. In this example, the first portion 102 and the second portion 104 are not adjacent to each other in the integrated device 100. The wiring may be used to connect circuitry in the first portion 102 to circuitry in the second portion 104.

The RF transceiver and some of the other circuitry located in the second portion 104 may generate electromagnetic fields significant enough to influence the operation of the MR sensor. As a result, the sensitive parts of the first portion 102 of the integrated device 100 may need to be physically separated from parts of the second portion 104 in order to provide optimal magnetic field sensing. FIG. 1C depicts one example in which the first portion 102 is physically separated from the second portion 104. The amount of separation may be determined using theoretical or empirical means, for example.

Figure 2A:
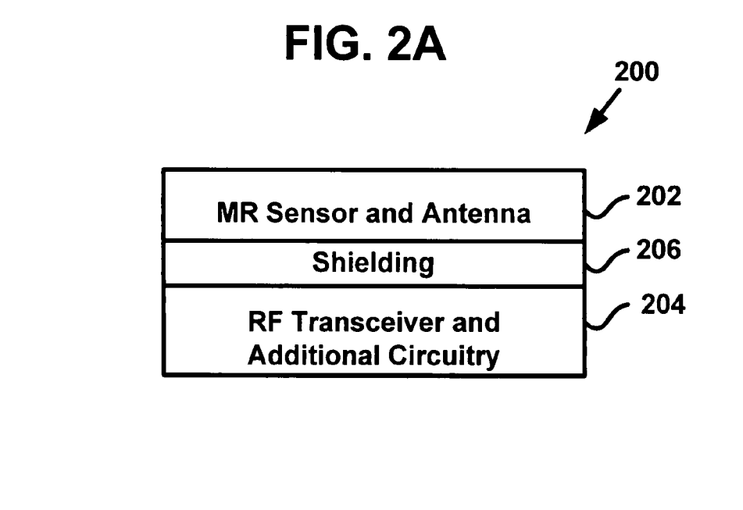
FIGS. 2A-2C are simplified block diagrams of an integrated MR sensor and an RF transceiver depicting shielding features, according to some examples.
Figure 2B:
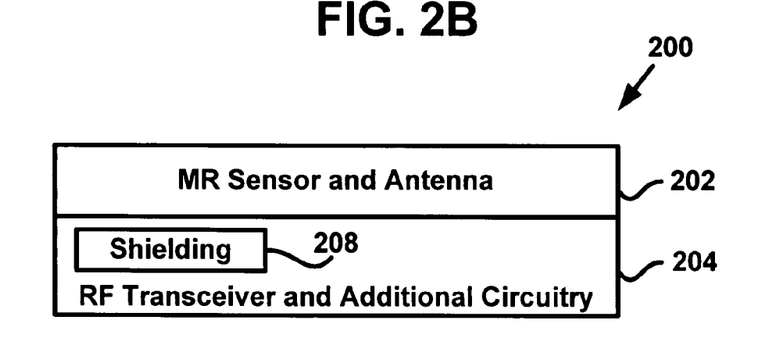
Figure 2C:
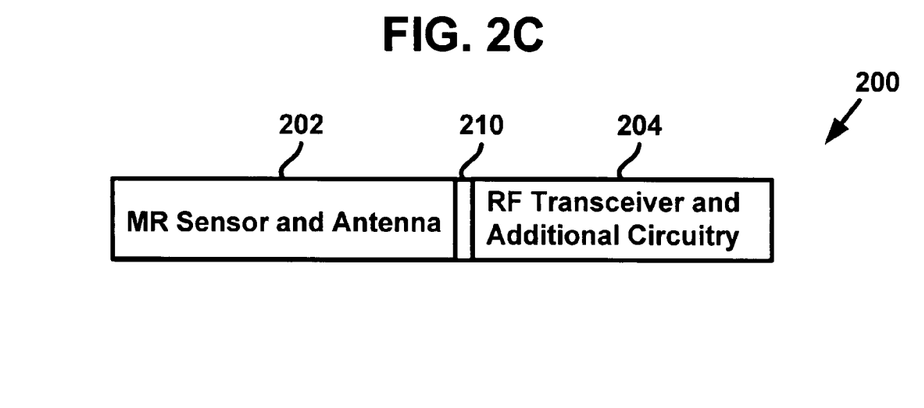

As an alternative to introducing physical separation between potentially interfering parts of an integrated device 200, a shielding layer 206-210 may be provided. FIGS. 2A-2C illustrate three example configurations for such a shield. Use of a shielding layer will likely allow tighter integration of the device 200 than use of physical separation of physical parts. The shielding layer 206-210 may be composed of a metal or a magnetic material (e.g., NiFe film). Other materials for the shielding layer 206-210 may also be suitable.

In FIG. 2A, the device 200 is a single die integration of the MR sensor and the RF transceiver with a shielding layer 206 located substantially between the two portions 202, 204. In this example, the first portion 202 and the second portion 204 are formed in discrete vertical layers on the same die. The shielding layer 206 may extend over some of or over the entire interface between the first and second portions 202, 204, depending on the characteristics of the electromagnetic fields and the location of sensitive components.

FIG. 2B illustrates a single die integrated MR sensor and RF transceiver with a shielding layer 208 located within the second portion 204. In this example, the first portion 202 and the second portion 204 are formed in discrete vertical layers on the same die. The shielding layer 208 is a localized shield which may be beneficial when the majority of the magnetic field effects originate from a relatively small part of the second portion 204. The shield 208 may also be advantageous in designs having electrical connections between the first and second portions 202, 204. The size and location of the shielding layer 208 may be varied as necessary to properly shield sensitive components.

FIG. 2C illustrates an integrated MR sensor and RF transceiver with a shielding layer 210 located substantially between the first portion 202 and the second portion 204. In this example, the first portion 202 and the second portion 204 are formed in discrete horizontal layers on the same die. The shielding layer 210 may extend over some or over the entire interface between the first portion 202 and the second portion 204, depending on the characteristics of the electromagnetic fields and the location of sensitive components.

Figure 3:
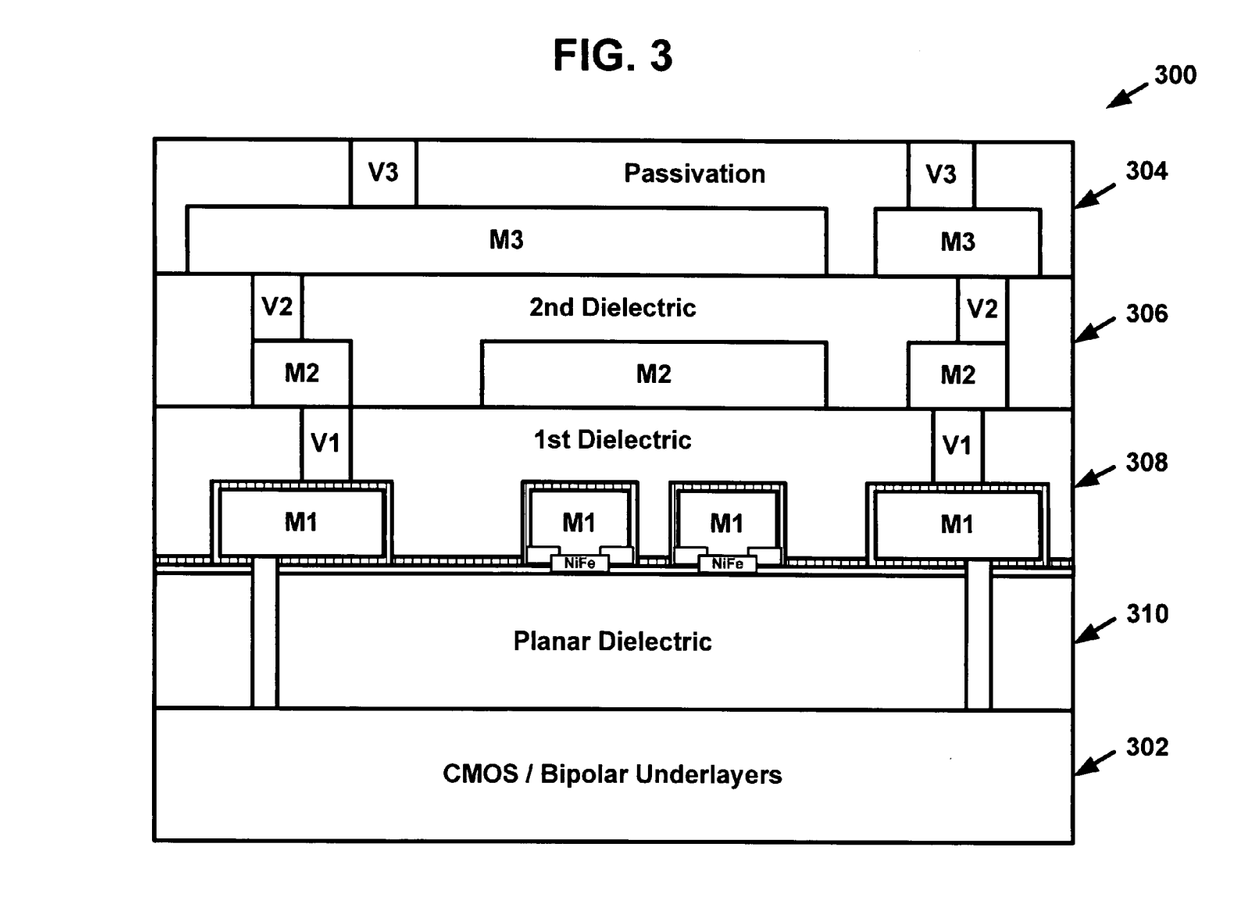
FIG. 3 is a side view of an MR sensor and an RF transceiver integrated in a single die, according to an example.

FIG. 3 is a side view of a device 300 in which an MR sensor is integrated with an RF transceiver on a single die. Shown in FIG. 3 are CMOS/Bipolar underlayers 302 (also referred to as the RF transceiver layers), a planar dielectric layer 310, contacts V1-V3, metal interconnection layers M1-M3, a first dielectric layer 308, a second dielectric layer 306, and a passivation layer 304. The RF transceiver along with any additional circuitry, such as power conditioning electronics, MR sensing electronics, and control and I/O electronics, may be fabricated largely within the RF transceiver underlayers 302, while an MR sensor and an antenna may be fabricated within or between the metal interconnection layers M1-M3, above the planar dielectric layer 310. Alternatively, the MR sensor may be used as the antenna.

Preferably, the RF transceiver underlayers 302 are fabricated first because its fabrication processes usually require the highest temperatures. A substantially planar dielectric layer 310 (e.g., contact glass) is then deposited on the RF transceiver underlayers 302. The planar dielectric layer 306 provides a substantially planar surface on which the MR sensor and antenna can be fabricated, as well as electrically isolating the RF transceiver underlayers 302 from the upper layers 304-308. The MR sensor and the antenna are then fabricated within or between the metal interconnection layers M1-M3. Preferably, the antenna is located within the highest interconnection layer M3.

Layers 304-308 may be formed using standard lithography, metallization, and etch processes, while layers 310 and 302 may be formed using Honeywell's MOI-5 0.35 micron processing or GaAs processing. Other components of the MR sensor (such as set, reset, and offset straps; signal conditioning circuitry, and ESD protection circuitry) may be included in various locations in the layers 308-310 and 302, and are not fully illustrated in FIG. 3.

Figure 4:
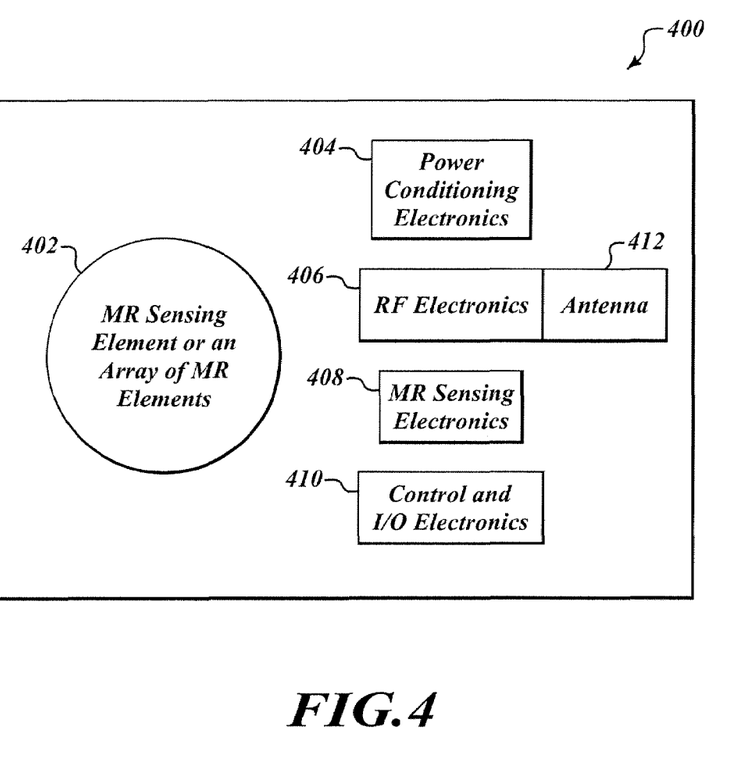
FIG. 4 is a top view of a MR sensor with RF transceiver components, according to an example.

FIG. 4 illustrates a plan view of a device 400 in which an MR sensor is integrated with an RF transceiver on a single chip. The structures visible in FIG. 4 include a MR sensing element 402, power conditioning electronics 404, RF electronics 406, MR sensing electronics 408, control and I/O electronics 410, and an antenna 412. More than one MR sensing element 402 may be used. For example, the RF transceiver may be designed to wirelessly transmit outputs from an array of MR sensing elements 402.

The MR sensing element 402 may be any element that can detect variations in magnetic fields, whether natural or man-made. For example, the MR sensing element 402 may be an AMR sensor, a GMR sensor, a CMR sensor, a Hall sensor, a fluxgate sensor, or a coil sensor. The MR sensing element 402 may also include one or more straps through which current may be run for controlling and adjusting the element's sensing characteristics. For example, the MR sensing element 402 may include set, reset, and offset straps.

The MR sensing electronics 408 include any electronics needed to convert an output of the MR sensing element 402 to a user-recognizable output. For example, the MR sensing electronics 408 may include an analog-to-digital (A/D) converter, a processor, a memory device, and a display or other type of output device. Additionally, the MR sensing electronics 408 may include driver circuitry for controlling the set, reset, and/or offset straps.

The RF electronics 406 include the circuitry needed for the RF transceiver. For example, the RF electronics 406 may include digital-to-analog (D/A) converters, low-pass filters for filtering the outputs of the D/A converters, and a modulator that performs a frequency conversion on signals received at its inputs and which is driven by a phase-locked loop (PLL) circuit that includes a reference voltage controlled oscillator (VCO) and a resonator (tank circuit). The modulator's output is fed to a power amplifier, and the amplified output is filtered with a bandpass filter and connected to the antenna 412. RF transceiver designs are well known in the art, and any appropriate RF transceiver design may be used.

The antenna 412 is incorporated with the MR sensing element 402 in the die. Preferably, the antenna 412 is a loop antenna. A loop antenna includes a multi-turn loop of less than 1/10th wavelength in length. Other antenna designs may also be used.

The power conditioning electronics 404 are used to control the power to the integrated device, especially during initial startup of the device. The control and I/O electronics 410 provide control signals and input/output signal conditioning to the device. The power conditioning electronics 404 and the control and I/O electronics 410 are standard electronics and any appropriate design may be used in the device 400.

Figure 5:
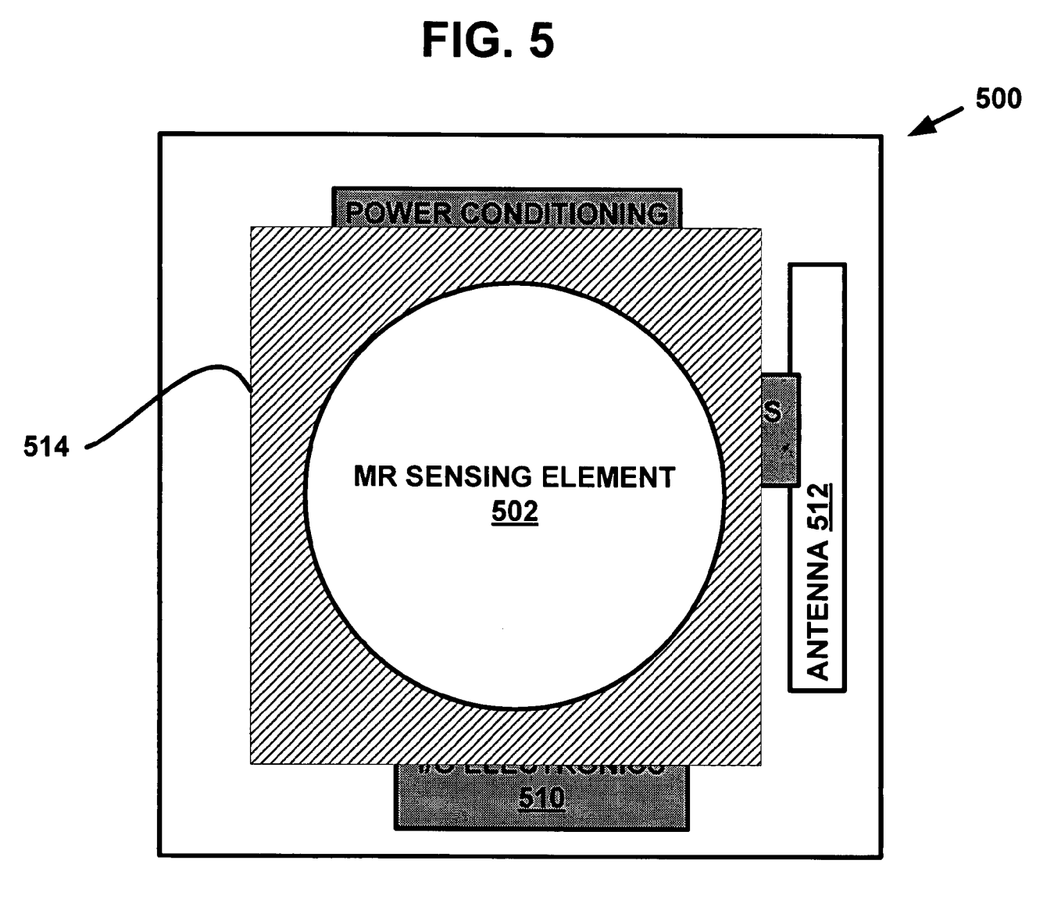
FIG. 5 is a top view of the MR sensor with the RF transceiver components depicted in FIG. 4 with a shield located between the MR sensor and other components, according to an example.

FIG. 5 illustrates a plan view of a device 500 in which an MR sensor is integrated with an RF transceiver on a single chip. The device 500 is substantially the same as the device 400, except the device 500 includes a shield layer 514 located substantially between the MR sensing element 502 and the power conditioning electronics 504, RF electronics 506, MR sensing electronics 508, and control and I/O electronics 510. The electronics 504-510 cannot be fully seen in FIG. 5 due to the location of the shield layer 514. Preferably, the shield layer 514 does not extend over the antenna 512. The shielding layer 514 may be composed of a metal, a magnetic material (e.g., NiFe film), or any other suitable material.

Figure 6:
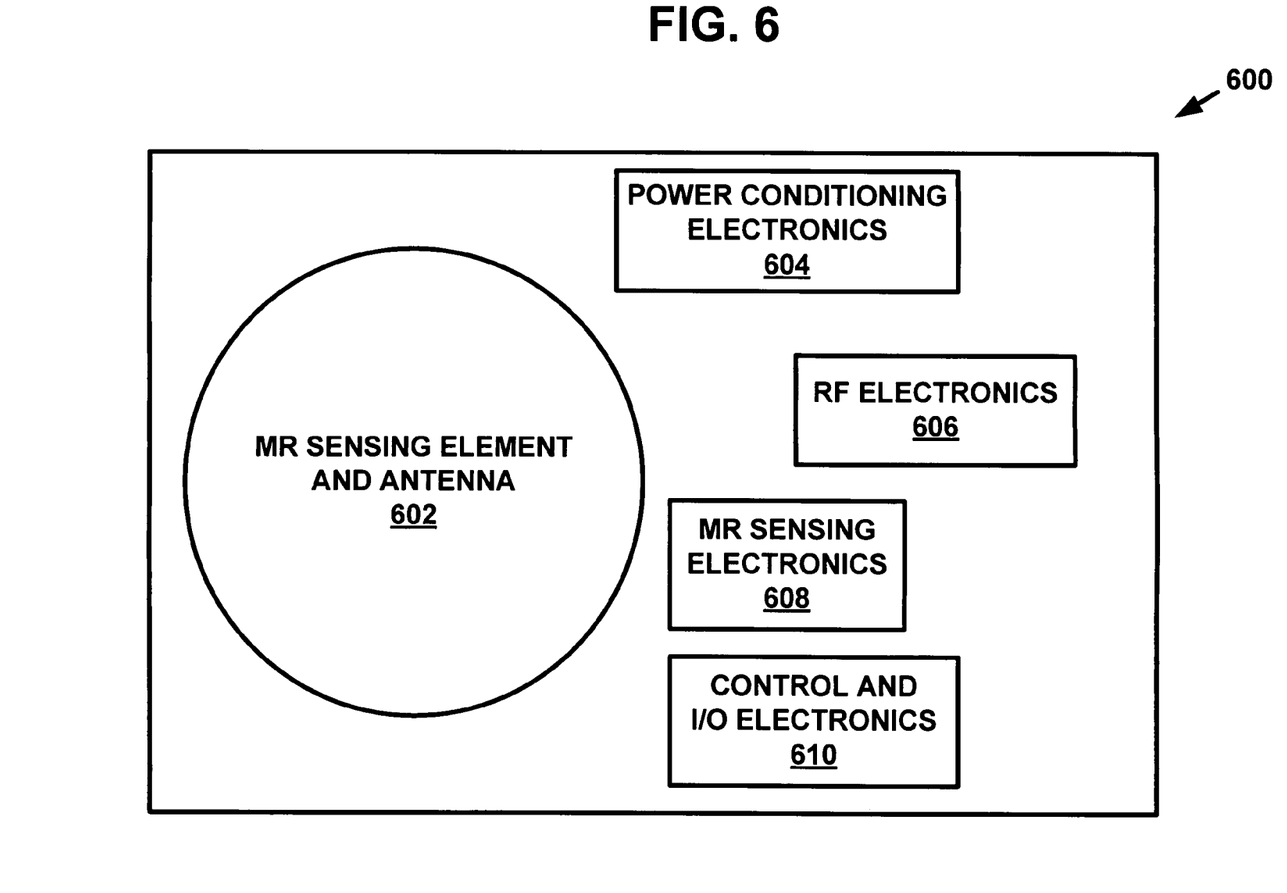
FIG. 6 is a top view of a MR sensor with RF transceiver components, according to another example.

FIG. 6 illustrates a plan view of a device 600 in which an MR sensor is integrated with an RF transceiver on a single chip. The structures visible in FIG. 6 include a combined MR sensing element and antenna 602, power conditioning electronics 604, RF electronics 606, MR sensing electronics 608, and control and I/O electronics 610. The device 600 is similar to the device 400 depicted in FIG. 4, but uses a larger MR sensing element that can also be used as the antenna. Additional real estate may be saved by using the MR sensing element as the antenna for the RF transceiver. Moreover, the device 600 may have a larger antenna aperture than the device 400.

The MR sensing element may be used as the antenna when the size of the MR sensing element is compatible with the resonant frequency of the wireless transmission. For example, when the MR sensing element is at ¼ or ½ wavelength resonance at the transmission frequency, the MR sensing element may be used as the radiating element/ground plane of the antenna.

Table 1, below, shows a simplified exemplary process for integrating a RF transceiver with a magnetic field sensing device. It is believed that such a process is unique because, in the past, semiconductor foundries have gone to great lengths to prevent contamination of their processes with materials typically used in manufacturing magnetic sensors. In addition, companies in the magnetic industries (e.g., disk drive head manufacturers, etc.) have been separate from electronics companies, and their specialized manufacturing techniques have been kept largely separate from one another.

TABLE 1

Sample Manufacturing Process

CMOS (bulk or SOI), Bipolar, GaAs, BiCMOS, InP, underlayers
(end front-end processing; begin back-end processing)
Deposit contact glass (if any), reflow
Form magnetic field sensing device layer (MR and additional metallization layers)
Inspection and evaluation/test/package In a preferred embodiment, the semiconductor device processing (i.e. CMOS, Bipolar, GaAs, etc.) is done at the front end, while the metal interconnect and the magnetic field sensing device are done at the back end. Table 1 is intended to be generally applicable to any manufacturing process, and thus does not include detail on how to obtain particular architectures. Additional cleaning and other steps are also implemented as appropriate.

It should be understood that the illustrated embodiments are examples only and should not be taken as limiting the scope of the present invention. For example, while an MR sensor has been used to describe the invention, any magneto-resistive sensor, such as AMR, GMR, and CMR, or other magnetic field sensing device may be used. Similarly, this invention is not limited to any particular RF transceiver design. The claims should not be read as limited to the described order or elements unless stated to that effect. Therefore, all embodiments that come within the scope and spirit of the following claims and equivalents thereto are claimed as the invention.

We claim:

1. A system on an integrated circuit chip, comprising in combination:
   at lease one magnetic field sensing device in a first portion of the integrated circuit; and
   a transceiver co-located with the at least one magnetic field sensing device in a second portion of the integrated circuit.

2. The system of claim 1, wherein the at least one magnetic field sensing device is located in a first portion of the integrated circuit and the transceiver is located in a second portion of the integrated circuit.

3. The system of claim 2, further comprising an antenna located in first portion of the integrated circuit.

4. The system of claim 2, further comprising additional circuitry in the second portion of the integrated circuit.

5. The system of claim 4, wherein the additional circuitry is selected from the group consisting of power conditioning electronics, MR sensing electronics, and control and I/O electronics.

6. The system of claim 2, further comprising a shielding layer to prevent electromagnetic fields generated in the second portion of the integrated circuit from interfering with the MR sensor operation.

7. The system of claim 1, wherein the at least one magnetic field sensing device is a sensor selected from the group consisting of an anisotropic magneto-resistive (AMR) sensor, a giant magneto-resistive (GMR) sensor, a colossal magneto-resistive (CMR) sensor, a Hall sensor, a fluxgate sensor, and a coil sensor.

8. The system of claim 1, wherein the transceiver wirelessly transmits data from the at least one magnetic field sensing device.

9. The system of claim 1, wherein the at least one magnetic field sensing device includes an array of magnetic field sensing devices, wherein the transceiver wirelessly transmits data from the array magnetic field sensing devices.

10. A system on a chip, comprising in combination:
    at least one magnetic field sensing device and an antenna in a first portion of an integrated circuit; and
    a transceiver located in a second portion of the integrated circuit, wherein the transceiver wirelessly transmits data from the at least one magnetic field sensing device.

* * * * *